(12) United States Patent
Lin et al.

(10) Patent No.: US 11,387,176 B2
(45) Date of Patent: Jul. 12, 2022

(54) SEMICONDUCTOR PACKAGE STRUCTURE

(71) Applicant: MEDIATEK INC., Hsinchu (TW)

(72) Inventors: Tzu-Hung Lin, Hsinchu (TW);
Yuan-Chin Liu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 109 days.

(21) Appl. No.: 16/813,898

(22) Filed: Mar. 10, 2020

(65) Prior Publication Data

US 2020/0211944 A1 Jul. 2, 2020

Related U.S. Application Data

(63) Continuation-in-part of application No. 15/906,098, filed on Feb. 27, 2018, now Pat. No. 10,784,211.

(60) Provisional application No. 62/818,174, filed on Mar. 14, 2019, provisional application No. 62/470,915, filed on Mar. 14, 2017.

(51) Int. Cl.
*H01L 23/498* (2006.01)
*H01L 23/31* (2006.01)
*H01L 23/00* (2006.01)
*H01L 25/065* (2006.01)

(52) U.S. Cl.
CPC .... *H01L 23/49816* (2013.01); *H01L 23/3192* (2013.01); *H01L 24/13* (2013.01); *H01L 24/45* (2013.01); *H01L 24/73* (2013.01); *H01L 25/0655* (2013.01)

(58) Field of Classification Search
None
See application file for complete search history.

(56) References Cited

U.S. PATENT DOCUMENTS 5,841,194 A 11/1998 Tsukamoto
6,020,221 A 2/2000 Lim et al.
(Continued)

FOREIGN PATENT DOCUMENTS

CN 1163480 A 10/1997
CN 102110660 A 6/2011
(Continued)

OTHER PUBLICATIONS

European Search Report dated May 6, 2020, issued in application No. EP 19213567.1.
(Continued)

*Primary Examiner* — Long Pham
(74) *Attorney, Agent, or Firm* — McClure, Qualey & Rodack, LLP

(57) ABSTRACT

A semiconductor package structure is provided. The semiconductor package structure includes a substrate, a first semiconductor die, and a second semiconductor die. The substrate includes a first substrate partition and a second substrate partition. The first substrate partition has a first wiring structure. The second substrate partition is adjacent to the first substrate partition and has a second wiring structure. The first substrate partition and the second substrate partition are surrounded by a first molding material. The first semiconductor die is disposed over the substrate and electrically coupled to the first wiring structure. The second semiconductor die is disposed over the substrate and electrically coupled to the second wiring structure.

21 Claims, 11 Drawing Sheets

(56) References Cited

U.S. PATENT DOCUMENTS

| | | | |
|---|---|---|---|
| 8,247,900 | B2 | 8/2012 | Yuan |
| 8,710,629 | B2 | 4/2014 | Bai et al. |
| 9,209,048 | B2 | 12/2015 | Huang et al. |
| 9,412,662 | B2 | 8/2016 | Lin et al. |
| 9,425,171 | B1 | 8/2016 | Minacapelli et al. |
| 9,543,249 | B1 | 1/2017 | Hu |
| 10,529,645 | B2 | 1/2020 | Gandhi et al. |
| 2001/0017408 | A1 | 8/2001 | Baba |
| 2002/0011907 | A1 | 1/2002 | Yamada et al. |
| 2004/0150118 | A1 | 8/2004 | Honda |
| 2007/0001278 | A1 | 1/2007 | Jeon et al. |
| 2007/0069366 | A1 | 3/2007 | Chang et al. |
| 2007/0194464 | A1 | 8/2007 | Fukuzono |
| 2008/0054490 | A1 | 3/2008 | McLellan et al. |
| 2008/0179725 | A1 | 7/2008 | Chia et al. |
| 2008/0237840 | A1 | 10/2008 | Alcoe et al. |
| 2008/0258293 | A1 | 10/2008 | Yang et al. |
| 2009/0236730 | A1 | 9/2009 | Topacio et al. |
| 2010/0276799 | A1 | 11/2010 | Heng et al. |
| 2011/0156235 | A1 | 6/2011 | Yuan |
| 2012/0018871 | A1* | 1/2012 | Lee .................. H01L 23/4334 |
| | | | 257/698 |
| 2012/0182694 | A1 | 7/2012 | Lin et al. |
| 2012/0188721 | A1 | 7/2012 | Ho et al. |
| 2013/0234304 | A1 | 9/2013 | Tamaki |
| 2014/0070423 | A1 | 3/2014 | Woychik et al. |
| 2015/0186769 | A1 | 7/2015 | Boiron et al. |
| 2015/0187737 | A1 | 7/2015 | Lin et al. |
| 2015/0260929 | A1 | 9/2015 | Matsumaru et al. |
| 2016/0351467 | A1 | 12/2016 | Li |
| 2017/0018510 | A1 | 1/2017 | Shen et al. |
| 2018/0138127 | A1 | 5/2018 | Lee et al. |
| 2018/0175001 | A1 | 6/2018 | Pyo et al. |
| 2018/0204807 | A1* | 7/2018 | Aizawa ............. H01L 23/49822 |
| 2018/0237840 | A1 | 8/2018 | Marggraf-Rogalla et al. |
| 2018/0269164 | A1 | 9/2018 | Lin et al. |
| 2018/0350772 | A1 | 12/2018 | Nair et al. |
| 2018/0374820 | A1 | 12/2018 | Ko et al. |
| 2019/0115269 | A1 | 4/2019 | Pan et al. |

FOREIGN PATENT DOCUMENTS

| | | |
|---|---|---|
| CN | 201936868 U | 8/2011 |
| CN | 103038877 A | 4/2013 |
| CN | 103066029 A | 4/2013 |
| CN | 203659838 U | 6/2014 |
| DE | 198 30 158 A1 | 4/1999 |
| DE | 10 2013 200 518 A | 7/2013 |
| EP | 0 797 253 A2 | 9/1997 |
| EP | 2 066 160 A2 | 6/2009 |
| EP | 3 376 535 A1 | 9/2018 |
| JP | 2003-017625 A | 1/2003 |
| JP | 2004-247464 A | 9/2004 |
| KR | 10-2008-0093909 A | 10/2008 |
| TW | 201546954 A | 12/2015 |
| TW | 201546954 A2 | 12/2015 |
| TW | 201608653 A | 3/2016 |
| TW | 201705414 A | 2/2017 |
| TW | M563659 U | 7/2018 |
| TW | 201834164 A | 9/2018 |
| TW | M572570 U | 1/2019 |
| WO | 2013/119309 A1 | 8/2013 |

OTHER PUBLICATIONS

Chinese language office action dated May 7, 2020, issued in application No. CN 201810189557.2.

European Search Report dated May 27, 2020, issued in application No. EP 20162559.7.

Chinese language office action dated Jun. 19, 2020, issued in application TW 109108155.

Chinese language office action dated Jun. 2, 2021, issued in application No. CN 201911261556.5.

Chinese language office action dated Mar. 31, 2021, issued in application No. TW 108145283.

Chinese language office action dated Jan. 13, 2021, issued in application No. TW 109120165.

Non-Final Office Action dated Oct. 21, 2020, issued in U.S. Appl. No. 16/563,919.

European Search Report dated Nov. 13, 2020, issued in application No. EP 20178978.1.

European Search Report dated Jan. 24, 2020, issued in application No. EP 19196606.8.

Chinese language office action dated Sep. 14, 2021, issued in application No. TW 108145283.

* cited by examiner

SEMICONDUCTOR PACKAGE STRUCTURE

CROSS REFERENCE TO RELATED APPLICATIONS

This application is a Continuation-In-Part of application Ser. No. 15/906,098, filed on Feb. 27, 2018, which claims the benefit of provisional Application No. 62/470,915, filed on Mar. 14, 2017. This application also claims the benefit of U.S. Provisional Application No. 62/818,174 filed on Mar. 14, 2019, the entirety of which is incorporated by reference herein.

BACKGROUND OF THE INVENTION

Field of the Invention

The present invention relates to a semiconductor package structure, and in particular to a semiconductor package structure with substrate partitions.

Description of the Related Art

A semiconductor package can not only provide a semiconductor die with protection from environmental contaminants, but it can also provide an electrical connection between the semiconductor die packaged therein and a substrate, such as a printed circuit board (PCB). For instance, a semiconductor die may be enclosed in an encapsulating material, and traces are electrically connected to the semiconductor die and the substrate.

However, a problem with such a semiconductor package is that it is subject to different temperatures during the packaging process. The semiconductor package may be highly stressed due to the different coefficients of thermal expansion (CTEs) of the various substrate and semiconductor die materials. As a result, the semiconductor package may exhibit warping or cracking so that the electrical connection between the semiconductor die and the substrate may be damaged, and the reliability of the semiconductor package may be decreased.

This problem is exacerbated in the case of a relatively large package, for example a package of 50 mm×50 mm or larger. Therefore, a novel semiconductor package structure is desirable.

BRIEF SUMMARY OF THE INVENTION

Semiconductor package structures are provided. An exemplary embodiment of a semiconductor package structure includes a substrate, a first semiconductor die, and a second semiconductor die. The substrate includes a first substrate partition and a second substrate partition. The first substrate partition has a first wiring structure. The second substrate partition is adjacent to the first substrate partition and has a second wiring structure. The first substrate partition and the second substrate partition are surrounded by a first molding material. The first semiconductor die is disposed over the substrate and electrically coupled to the first wiring structure. The second semiconductor die is disposed over the substrate and electrically coupled to the second wiring structure.

Another exemplary embodiment of a semiconductor package structure includes a first substrate, a second substrate, a redistribution layer, and a frame. The first substrate has a first wiring structure. The second substrate has a second wiring structure. The first substrate and the second substrate are arranged side-by-side. The redistribution layer is disposed over the first substrate and the second substrate, wherein the redistribution layer is electrically coupled to the first wiring structure and the second wiring structure. The frame surrounds the first substrate and the second substrate.

Yet another exemplary embodiment of a semiconductor package structure includes a first substrate, a second substrate, a first semiconductor die, a second semiconductor die, a plurality of first antenna structures, and a plurality of second antenna structures. The first substrate has a first wiring structure. The second substrate has a second wiring structure. The first substrate and the second substrate are arranged side-by-side. The first semiconductor die is disposed over the first substrate and electrically coupled to the first wiring structure. The second semiconductor die is disposed over the second substrate and electrically coupled to the second wiring structure. The plurality of first antenna structures are disposed over the first substrate and electrically coupled to the first wiring structure. The plurality of second antenna structures are disposed over the second substrate and electrically coupled to the second wiring structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1A is a cross-sectional view of the semiconductor package structure along line I-I' of FIG. 1C;

DETAILED DESCRIPTION OF THE INVENTION

Figure 1A:
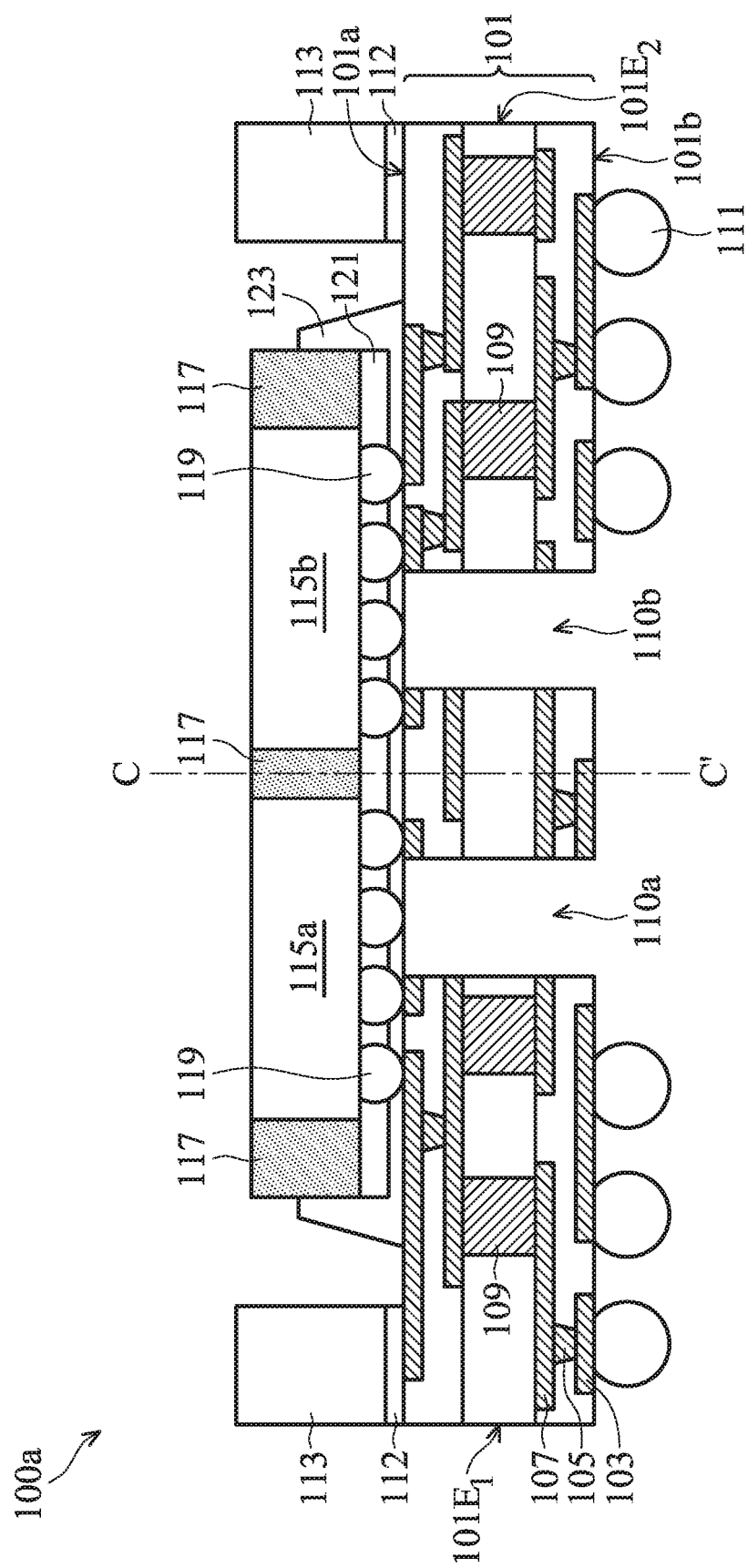
FIG. 1A is a cross-sectional view of a semiconductor package structure, in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention is described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1A is a cross-sectional view of a semiconductor package structure 100a, in accordance with some embodiments of the disclosure. FIG. 1C is a plan view of an arrangement of holes in a substrate 101 of the semiconductor package structure 100a shown in FIG. 1A, and FIG. 1A is a cross-sectional view of the semiconductor package structure 100a along line I-I' of FIG. 1C.

Additional features can be added to the semiconductor package structure 100a. Some of the features described below can be replaced or eliminated for different embodiments. To simplify the diagram, only a portion of the semiconductor package structure 100a is depicted in FIGS. 1A and 1C. In some embodiments, the semiconductor package structure 100a may include a wafer-level semiconductor package, such as a flip-chip semiconductor package.

Referring to FIG. 1A, the semiconductor package structure 100a may be mounted on a base (not shown). In some embodiments, the semiconductor package structure 100a may be a system-on-chip (SOC) package structure. Moreover, the base may include a printed circuit board (PCB) and may be formed of polypropylene (PP). In some embodiments, the base may include a package substrate. The semiconductor package structure 100a is mounted on the base by a bonding process. For example, the semiconductor package structure 100a may include bump structures 111. In some embodiments, the bump structures 111 may be conductive ball structures (such as ball grid array (BGA)), conductive pillar structures, or conductive paste structures that are mounted on and electrically coupled to the base in the bonding process.

In the embodiment, the semiconductor package structure 100a includes a substrate 101. The substrate 101 has a wiring structure therein. In some embodiments, the wiring structure in the substrate 101 is a fan-out structure, and may include one or more conductive pads 103, conductive vias 105, conductive layers 107 and conductive pillars 109. In such cases, the wiring structure in the substrate 101 may be disposed in one or more inter-metal dielectric (IMD) layers. In some embodiments, the IMD layers may be formed of organic materials, which include a polymer base material, non-organic materials, which include silicon nitride (SiNx), silicon oxide (SiOx), grapheme, or the like. For example, the IMD layers are made of a polymer base material. It should be noted that the number and configuration of the IMD layers, the conductive pads 103, the conductive vias 105, the conductive layers 107 and the conductive pillars 109 shown in the figures and only some examples and are not limitations to the present invention.

Moreover, the semiconductor package structure 100a also includes a first semiconductor die 115a and a second semiconductor die 115b bonded onto the substrate 101 through a plurality of conductive structures 119. The substrate 101 has a first surface 101a and a second surface 101b opposite thereto, the first surface 101a is facing the first semiconductor die 115a and the second semiconductor die 115b, and the second surface 101b is facing the above-mentioned base. The conductive structures 119 are disposed over the first surface 101a and below the first semiconductor die 115a and the second semiconductor die 115b, and the bump structures 111 are disposed over the second surface 101b of the substrate 101.

In some embodiments, the first semiconductor die 115a and the second semiconductor die 115b are electrically coupled to the bump structures 111 through the conductive structures 119 and the wiring structure in the substrate 101. In addition, the conductive structures 119 may be controlled collapse chip connection (C4) structures. It should be noted that the number of semiconductor dies integrated in the semiconductor package structure 100a is not limited to that disclosed in the embodiment.

In some embodiments, the first semiconductor die 115a and the second semiconductor die 115b are active devices. For example, the first semiconductor die 115a and the second semiconductor die 115b may be logic dies including a central processing unit (CPU), a graphics processing unit (GPU), a dynamic random access memory (DRAM) controller or any combination thereof. In some other embodiments, one or more passive devices are also bonded onto the substrate 101.

The first semiconductor die 115a and the second semiconductor dies 115b are arranged side-by-side. In some embodiments, the first semiconductor die 115a and the second semiconductor dies 115b are separated by a molding material 117. The molding material 117 surrounds the first semiconductor die 115a and the second semiconductor die 115b, and adjoins the sidewalls of the first semiconductor die 115a and the second semiconductor die 115b. In some embodiments, the molding material 117 includes a nonconductive material such as an epoxy, a resin, a moldable polymer, or another suitable molding material. In some embodiments, the molding material 117 is applied as a substantial liquid, and then is cured through a chemical reaction. In some other embodiments, the molding material 117 is an ultraviolet (UV) or thermally cured polymer applied as a gel or malleable solid, and then is cured through a UV or thermal curing process. The molding material 117 may be cured with a mold (not shown).

In some embodiments, the surfaces of the first semiconductor die 115a and the second semiconductor dies 115b facing away from the first surface 101a of the substrate 101 are exposed by the molding material 117, such that a heat dissipating device (not shown) can directly attached to the surfaces of the first semiconductor die 115a and the second semiconductor dies 115b. As a result, the heat-dissipation efficiency of the semiconductor package structure 100a can be improved, particularly for a large semiconductor package structure, such as 50 mm×50 mm, which is preferred for high power applications.

The semiconductor package structure 100a also includes a polymer material 121 disposed under the molding material 117, the first semiconductor die 115a and the second semiconductor die 115b, and between the conductive structures 119. The semiconductor package structure 100a further includes an underfill layer 123 interposed between the first surface 101a of the substrate 101 and the polymer material 121. In some embodiments, the first semiconductor die 115a, the second semiconductor dies 115b and the molding material 117 are surrounded by the underfill layer 123. The polymer material 121 and the underfill layer 123 are disposed to compensate for differing coefficients of thermal expansion (CTEs) between the substrate 101, the conductive structures 119, the first semiconductor die 115a and the second semiconductor dies 115b.

In addition, the semiconductor package structure 100a includes a frame 113 attached to the first surface 101a of the substrate 101 through an adhesive layer 112. The first semiconductor die 115a and the second semiconductor die 115b are surrounded by the frame 113 and the adhesive layer 112. In some embodiments, the frame 113 and the adhesive layer 112 are separated from the underfill layer 123 by a gap. The substrate 101 has a first edge 101E1 and a second edge 101E2 opposite thereto. In some embodiments, the first edge 101 E1 and the second edge 101E2 are coplanar with sidewalls of the frame 113 and the adhesive layer 112.

Still referring to FIG. 1A, the substrate 101 of the semiconductor package structure 100a includes a first hole 110a and a second hole 110b formed on the second surface 101b. In some embodiments, at least one of the first hole 110a and the second hole 110b penetrates through the substrate 101 from the first surface 101a to the second surface 101b. Although the first hole 110a and the second hole 110b shown in FIG. 1A penetrate through the substrate 101, in some other embodiments, both the first hole 110a and the second hole 110b do not penetrate through the substrate 101 from the first surface 101a to the second surface 101b. In some embodiments, the first hole 110a is covered by the first semiconductor die 115a, and the second hole 110b is covered by the second semiconductor die 115b. In other words, the first hole 110a is located within the projection of the first semiconductor die 115a on the substrate 101, and the second hole 110b is located within the projection of the second semiconductor die 115b on the substrate 101.

Specifically, the first semiconductor die 115a and the second semiconductor die 115b have a center line C-C' between them. The first hole 110a is disposed closer to the center line C-C' than the first edge 101E1 of the substrate 101, and the second hole 110b is disposed closer to the center line C-C' than the second edge 101E2 of the substrate 101. Although there are only two holes in the substrate 101 shown in FIG. 1A, it should be noted that there is no limitation on the number of the holes formed in the substrate 101.

In some embodiments, the first hole 110a and the second hole 110b are formed by a laser drilling process or another suitable process. It should be noted that the first hole 110a and the second hole 110b may be formed by the same forming process for the conductive pillars 109 in the wiring structure of the substrate 101. Moreover, the first semiconductor die 115a and the second semiconductor die 115b are bonded to the substrate 101 after forming the holes in the substrate 101. Therefore, the damage of the first semiconductor die 115a and the second semiconductor die 115b can be prevented.

Referring to FIG. 1C, which is a plan view of an arrangement of holes in a substrate 101 of the semiconductor package structure 100a shown in FIG. 1A, and FIG. 1A is a cross-sectional view of the semiconductor package structure 100a along line I-I' of FIG. 1C. It should be noted that FIG. 1C is the plan view from the bottom of the semiconductor package structure 100a. In other words, FIG. 1C is the plan view from the second surface 101b of the substrate 101, which the bump structures 111 are disposed on. In particular, the bump structures 111 are omitted for brevity.

As shown in FIG. 1C, the substrate 101 includes more than two holes. In particular, the substrate 101 further includes a third hole 110c and the fourth hole 110d formed on the second surface 101b. The third hole 110c is covered by the first semiconductor die 115a, and the fourth hole 110d is covered by the second semiconductor die 115b. It should be noted that the substrate 101 has a center 101C, and the first hole 101a, the second hole 101b, the third hole 110c, and the fourth hole 110d are disposed closer to the center 101C than the first edge 101E1 and the second edge 101E2 of the substrate 101.

The holes formed in the substrate 101, for example, the first hole 110a, the second hole 110b, the third hole 110c and the fourth hole 110d, are designed to release the stress in the substrate 101, especially the stress concentrated in the region below the interface between two semiconductor dies (i.e. the first semiconductor die 115a and the second semiconductor die 115b). Since the semiconductor package structure 100a may be highly stressed due to the different coefficients of thermal expansion (CTEs) of the substrate 101 and the semiconductor dies, the holes formed in the substrate 101 can solve the warping or cracking problems caused by mismatched CTEs. As a result, the electrical connection within the semiconductor package structure 100a may not be damaged, and the reliability of the semiconductor package structure 100a may be increased.

Figure 1B:
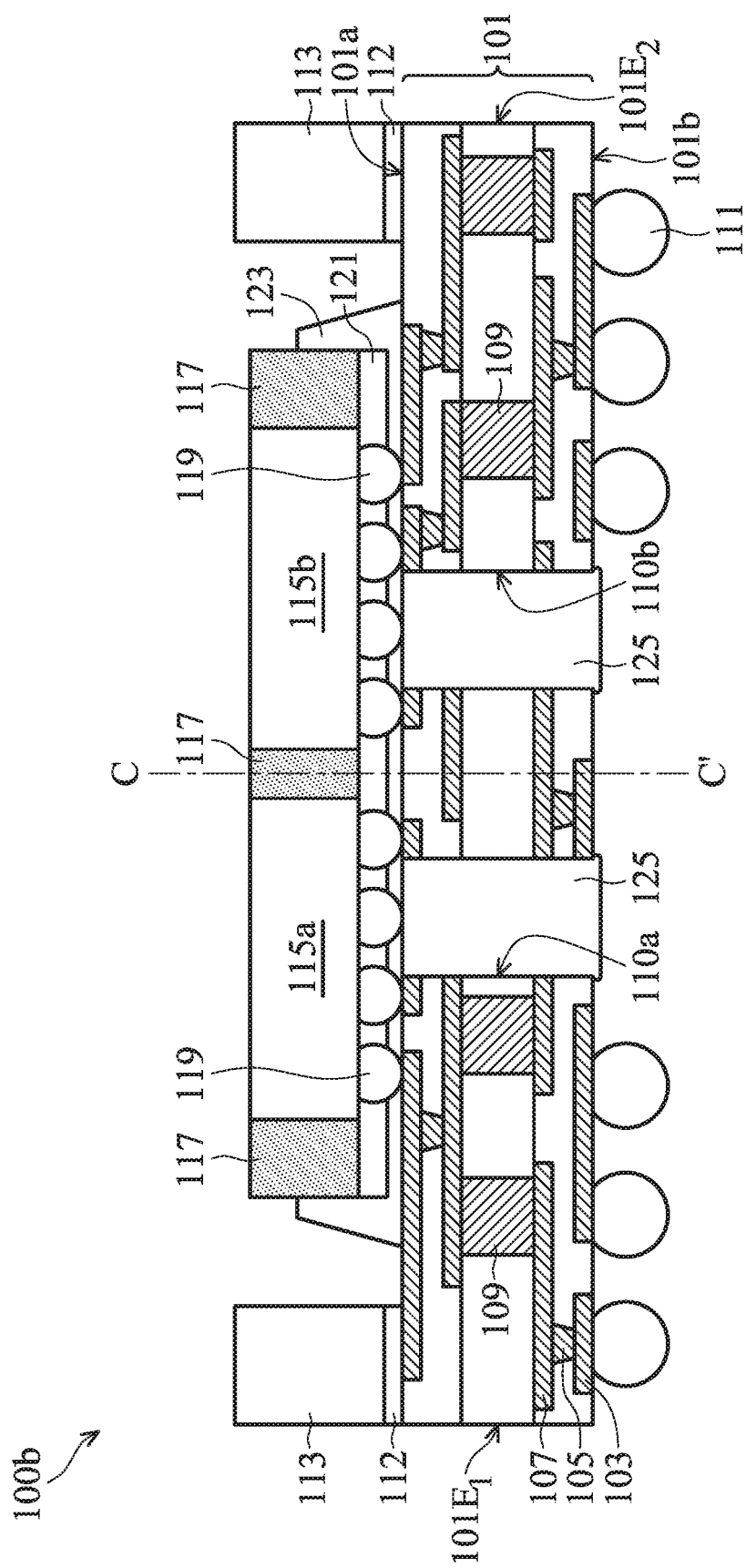
FIG. 1B is a cross-sectional view of a semiconductor package structure, in accordance with some other embodiments of the disclosure.
Figure 1C:
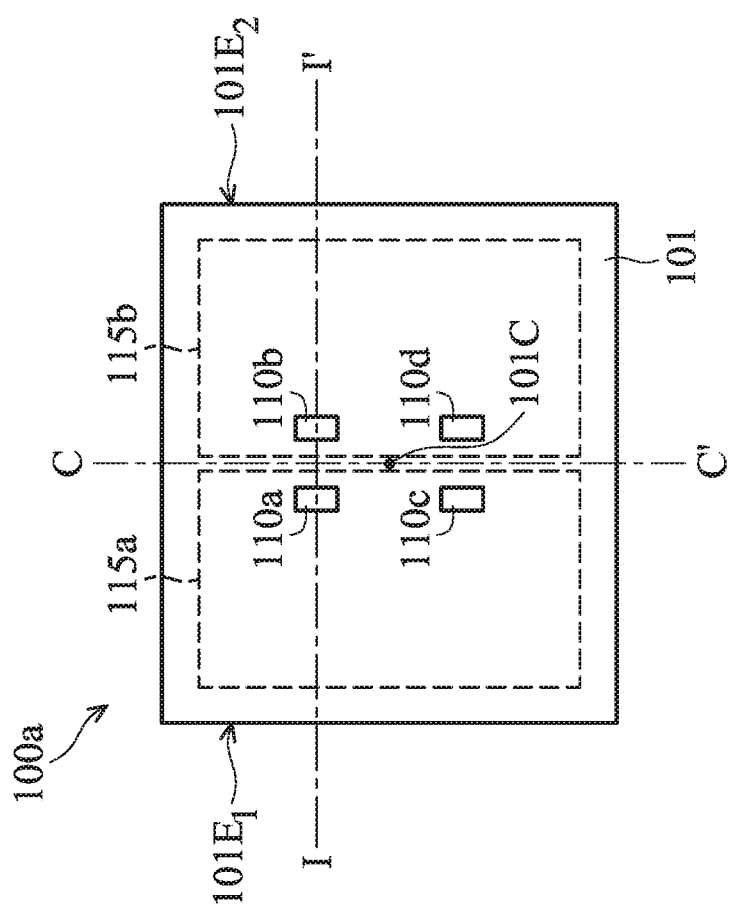
FIG. 1C is a plan view of an arrangement of holes in a substrate of the semiconductor package structure shown in FIG. 1A.

FIG. 1B is a cross-sectional view of a semiconductor package structure 100b, in accordance with some other embodiments of the disclosure. Descriptions of elements of the embodiments hereinafter that are the same as or similar to those previously described with reference to FIG. 1A are omitted for brevity.

As shown in FIG. 1B, the semiconductor package structure 100b includes a stress buffer layer 125 filled in the first hole 110a and the second hole 110b. The stress buffer layer 125 is made of a polymer material, such as a silicone resin or rubber. In some embodiments, the stress buffer layer 125 is made of an organic resin, such as Ajinomoto Build-up Film (ABF).

Moreover, the stress buffer layer 125 may be formed by a spin coating process. In some other embodiments, a material of the stress buffer layer 125 may be dispensed in the first hole 110a and the second hole 110b, and an excess portion of the material of the stress buffer layer 125 may be removed. In some embodiments, the stress buffer layer 125 may be formed before bonding the first semiconductor die 115a and the second semiconductor die 115b to the substrate 101.

In some embodiments, the stress buffer layer 125 may fill the first hole 110a and the second hole 110b, and the surfaces of the stress buffer layer 125 are level with the second surface 101b of the substrate 101. In some other embodiments, the surfaces of the stress buffer layer 125 may not be level with the second surface 101b of the substrate 101 according to the actual manufacturing processes.

Filling the first hole 110a and the second hole 110b with the stress buffer layer 125 may offer advantages like preventing the impurities and dusts from dropping into the first hole 110a and the second hole 110b during the handling process of the substrate 101. In addition, the warping or cracking problems caused by mismatched coefficients of thermal expansion in the semiconductor package structure 100b can be solved by the holes (including the first hole 110a and the second hole 110b) and the stress buffer layer 125 formed in the substrate 101. Accordingly, the electrical connection within the semiconductor package structure 100b may not be damaged, and the lifespan of the semiconductor package structure 100b may be increased.

Figure 2B:
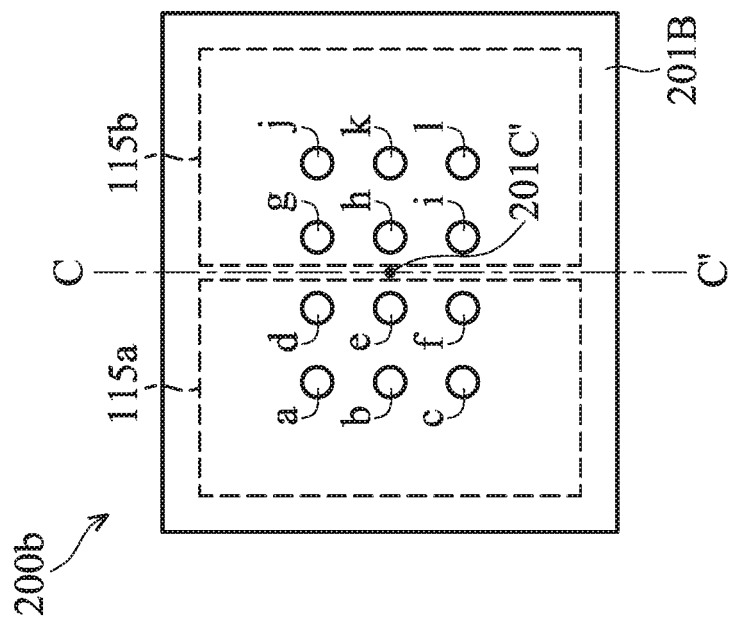
FIGS. 2A-2B are plan views showing shapes of holes in substrates of semiconductor package structures, in accordance with some embodiments of the disclosure.
Figure 2A:
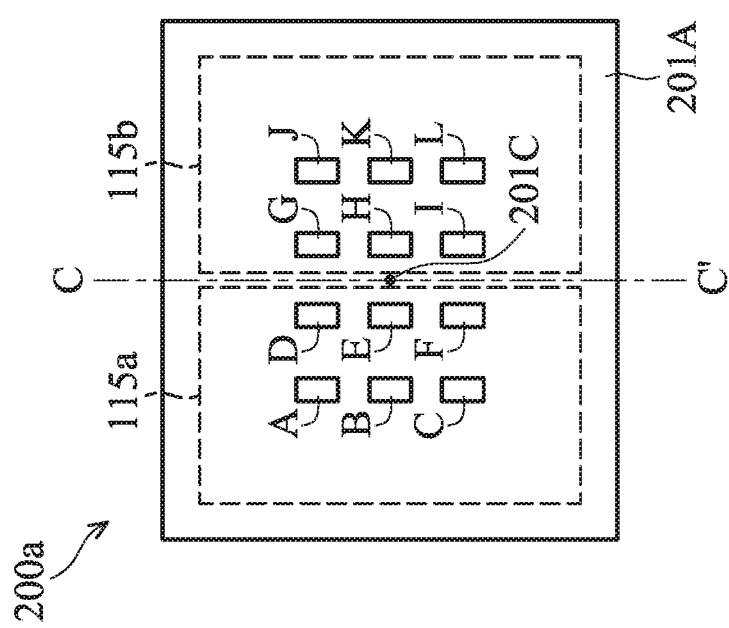

FIG. 2A is a plan view showing shapes of holes in a substrate 201A of a semiconductor package structure 200a, and FIG. 2B is a plan view showing shapes of holes in a substrate 201B of a semiconductor package structure 200b, in accordance with some embodiments of the disclosure. Descriptions of elements of the embodiments hereinafter that are the same as or similar to those previously described with reference to FIG. 1C are omitted for brevity.

Referring to FIG. 2A, the semiconductor package structure 200a has holes A, B, C, D, E, F, G, H, I, J, K and L in the substrate 201A, and the number of holes in the substrate 201A is much higher than that in the substrate 101 of the semiconductor package structure 100a. As shown in FIG. 2A, the holes A, B, C, D, E and F are covered by the first semiconductor die 115a, and the holes G, H, I, J, K and L are covered by the second semiconductor die 115b. In other words, the holes A-F are located within the projection of the first semiconductor die 115a on the substrate 201A, and the holes G-L are located within the projection of the second semiconductor die 115b on the substrate 201A.

Specifically, the holes A, B and C are arranged in a first array, the holes D, E and F are arranged in a second array, the holes G, H and I are arranged in a third array, and the holes J, K and L are arranged in a fourth array. The first array, the second array, the third array and the fourth array are parallel to the center line C-C' of the first semiconductor die 115a and the second semiconductor die 115b.

Referring to FIG. 2B, the substrate 201B in the semiconductor package structure 200b has holes a, b, c, d, e, f, g, h, i, j, k and l, which are arranged in the same way as the holes A-L of the substrate 201A in the semiconductor package structure 200a. The difference between the substrate 201A and the substrate 201B is that the holes a-l have circular shapes in the plan view. Compared with the holes A-L in the substrate 201A, which have rectangular shapes in the plan view, the problems of stress concentrated at the corners of the holes A-L can be prevented in the substrate 201B due to the round shapes of the holes a-l. Therefore, there is a lower probability of the cracking problem occurring in the substrate 201B of the semiconductor package structure 200b.

In some embodiments, stress buffer layers may optionally be formed in the holes A-L of the semiconductor package structure 200a and in the holes a-l of the semiconductor package structure 200b. It should be noted that the holes A-L are symmetrically located about the center line C-C' in the plan view of FIG. 2A, and the holes a-l are symmetrically located about the center line C-C' in the plan view of FIG. 2B. In some other embodiments, the holes A-L are symmetrically located about the center 201C of the substrate 201A in the plan view of FIG. 2A, and the holes a-l are symmetrically located about the center 201C' of the substrate 201B in the plan view of FIG. 2B.

Figure 3B:
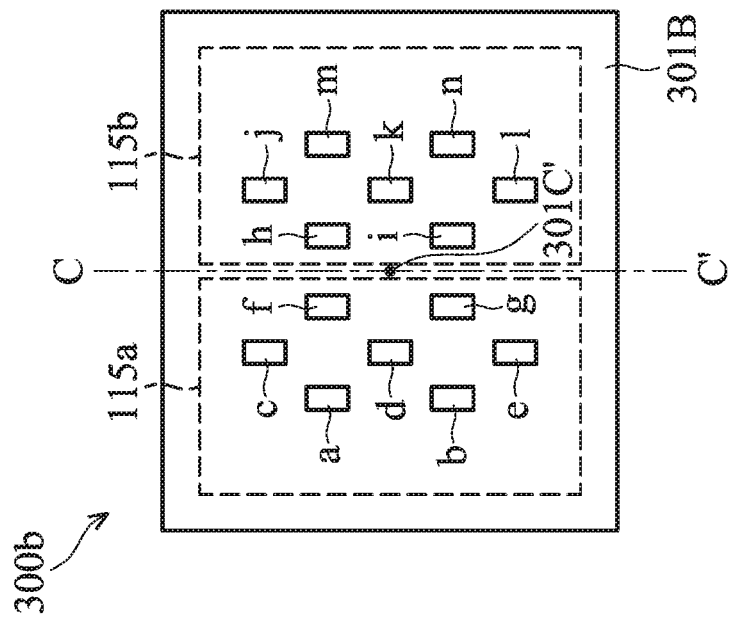
FIGS. 3A-3B are plan views showing arrangements of holes in substrate of semiconductor package structures, in accordance with some embodiments of the disclosure.
Figure 3A:
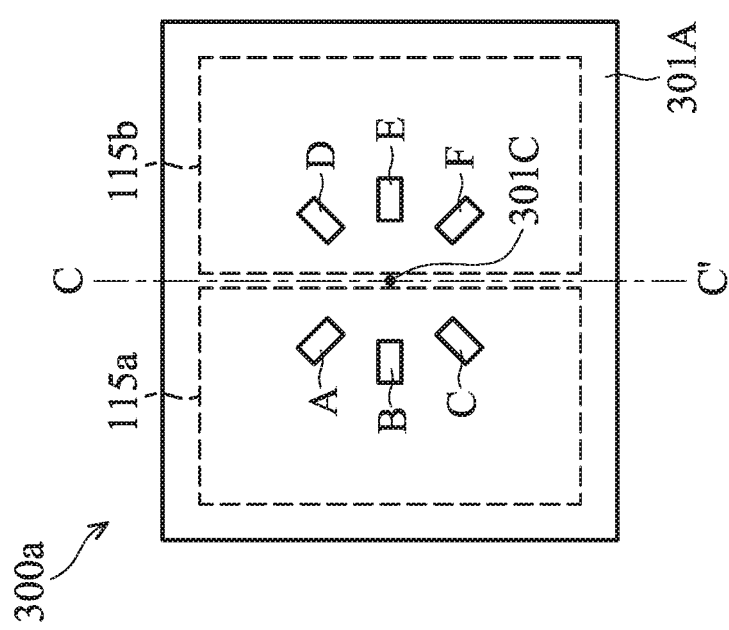

FIG. 3A is a plan view showing arrangements of holes in a substrate 301A of a semiconductor package structure 300a, and FIG. 3B is a plan view showing arrangements of holes in a substrate 301B of a semiconductor package structure 300b, in accordance with some embodiments of the disclosure. Descriptions of elements of the embodiments hereinafter that are the same as or similar to those previously described with reference to FIG. 2A are omitted for brevity.

Referring to FIG. 3A, the semiconductor package structure 300a has holes A, B, C, D, E, and F in the substrate 301A. The holes A, B and C are covered by the first semiconductor die 115a, and the holes D, E and F are covered by the second semiconductor die 115b. In other words, the holes A-C are located within the projection of the first semiconductor die 115a on the substrate 301A, and the holes D-F are located within the projection of the second semiconductor die 115b on the substrate 301A.

It should be noted that the holes A-F are arranged radially around the center 301C of the substrate 301A. In some other embodiments, the holes A-F are arranged radially around a center, and the center is located between the first semiconductor die 115a and the second semiconductor die 115b.

Compared with the semiconductor substrate 200a of FIG. 2A, the stress in the substrate 301A of the semiconductor package structure 300a, which has holes A-F arranged radially, can be released more efficiently. In other words, in order to obtain the same stress releasing effect as in the semiconductor package structure 200a, the number of the holes in the substrate 301A of the semiconductor package structure 300a can be less than the number of the holes in the substrate 201A of the semiconductor package structure 200a. However, the substrate 201A of the semiconductor package structure 200a, which has holes A-L arranged parallel to the center line C-C', is more easily to be manufactured than the substrate 301A of the semiconductor package structure 300a, which has holes A-F arranged radially.

Referring to FIG. 3B, the substrate 301B in the semiconductor package structure 300b has holes a, b, c, d, e, f, g, h, i, j, k, l, m and n arranged in a staggered arrangement in the substrate 301B. Specifically, the holes a-g are covered by the first semiconductor die 115a and staggered in the direction of the center line C-C', and the holes h-n are covered by the second semiconductor die 115b and staggered in the direction of the center line C-C'.

Compared with the semiconductor package structure 200a in FIG. 2A and the semiconductor package structure 300a in FIG. 3A, the substrate 301B of the semiconductor package structure 300b can combine the above-mentioned benefits of the hole arrangements of the substrate 201A in the semiconductor package structure 200a and the substrate 301A of the semiconductor package structure 300a. Specifically, the holes a-n in the substrate 301B can be manufactured easily, and the stress in the substrate 301B can be released efficiently.

In some embodiments, stress buffer layers may optionally be formed in the holes A-F of the semiconductor package structure 300a and the holes a-n of the semiconductor package structure 300b. It should be noted that the holes A-F are symmetrically located about the center line C-C' in the plan view of FIG. 3A, and the holes a-n are symmetrically located about the center line C-C' in the plan view of FIG. 3B. In some other embodiments, the holes A-F are symmetrically located about the center 301C of the substrate 301A in the plan view of FIG. 3A, and the holes a-n are symmetrically located about the center 301C' of the substrate 301B in the plan view of FIG. 3B.

Figure 4B:
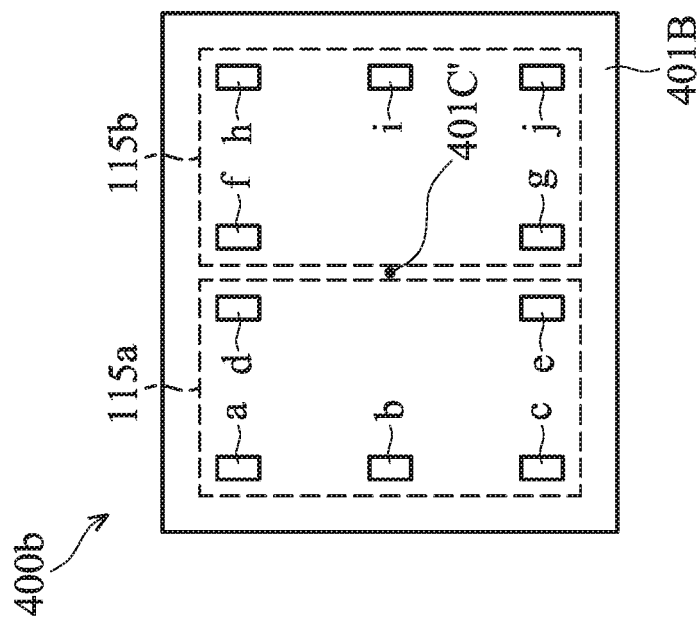
FIGS. 4A-4B are plan views showing locations of holes in substrates of semiconductor package structures, in accordance with some embodiments of the disclosure.
Figure 4A:
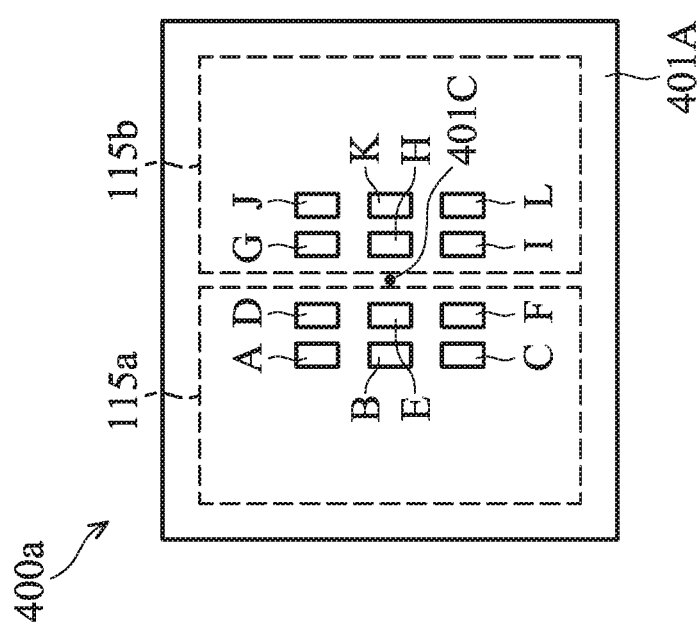

FIG. 4A is a plan view showing locations of holes in a substrate 401A of a semiconductor package structure 400a, and FIG. 4B is a plan view showing locations of holes in a substrate 401B of a semiconductor package structure 400b, in accordance with some embodiments of the disclosure. Descriptions of elements of the embodiments hereinafter that are the same as or similar to those previously described with reference to FIG. 2A are omitted for brevity.

Referring to FIG. 4A, the substrate 401A in the semiconductor package structure 400a has holes A, B, C, D, E, F, G, H, I, J, K and L arranged in the same way as the holes A-L of the substrate 201A in the semiconductor package structure 200a shown in FIG. 2A. The holes A-L are arranged parallel to the center line C-C' in the substrate 401A. The difference between FIGS. 2A and 4A is that the holes A-L in the substrate 401A are located closer to the center 401C of the substrate 401A than the holes A-L in the substrate 201A.

Since the maximum stress is likely to be concentrated at the center 401C of the substrate 401A, the stress in the substrate 401A of the semiconductor package structure 400a, which has holes A-L located closer to the center 401C of the substrate 401A, can be released more efficiently than the semiconductor package structure 200a.

Referring to FIG. 4B, the substrate 401B in the semiconductor package structure 400b has holes a, b, c, d, e, f, g, h, i and j located along the peripheral edge of the substrate 401B. In other words, the holes a-j are located far from the center 401C' of the substrate 401B to reserve space in the middle of the substrate 401B for routing. The semiconductor substrate 400b of FIG. 4B can provide a better routing capability for the substrate 401B than the semiconductor substrate 400a of FIG. 4A.

In some embodiments, stress buffer layers may optionally be formed in the holes A-L of the semiconductor package structure 400a and the holes a-j of the semiconductor package structure 400b. It should be noted that the holes A-L are symmetrically located about the center line C-C' in the plan view of FIG. 4A, and the holes a-j are symmetrically located about the center line C-C' in the plan view of FIG. 4B. In some other embodiments, the holes A-L are symmetrically located about the center 401C of the substrate 401A in the plan view of FIG. 4A, and the holes a-j are symmetrically located about the center 401C' of the substrate 401B in the plan view of FIG. 4B.

According to the foregoing embodiments, the holes formed in the substrate are designed to release the stress in the substrate, especially the stress concentrated in the region below the interface between two semiconductor dies. Since the semiconductor package structure may be highly stressed due to the different coefficients of thermal expansion (CTEs) of the substrate and the semiconductor dies, the holes formed in the substrate can solve the warping or cracking problems caused by mismatched CTEs. As a result, the electrical connection within the semiconductor package structure may remain undamaged, and the reliability and the lifespan of the semiconductor package structure may be increased.

Figure 5A:
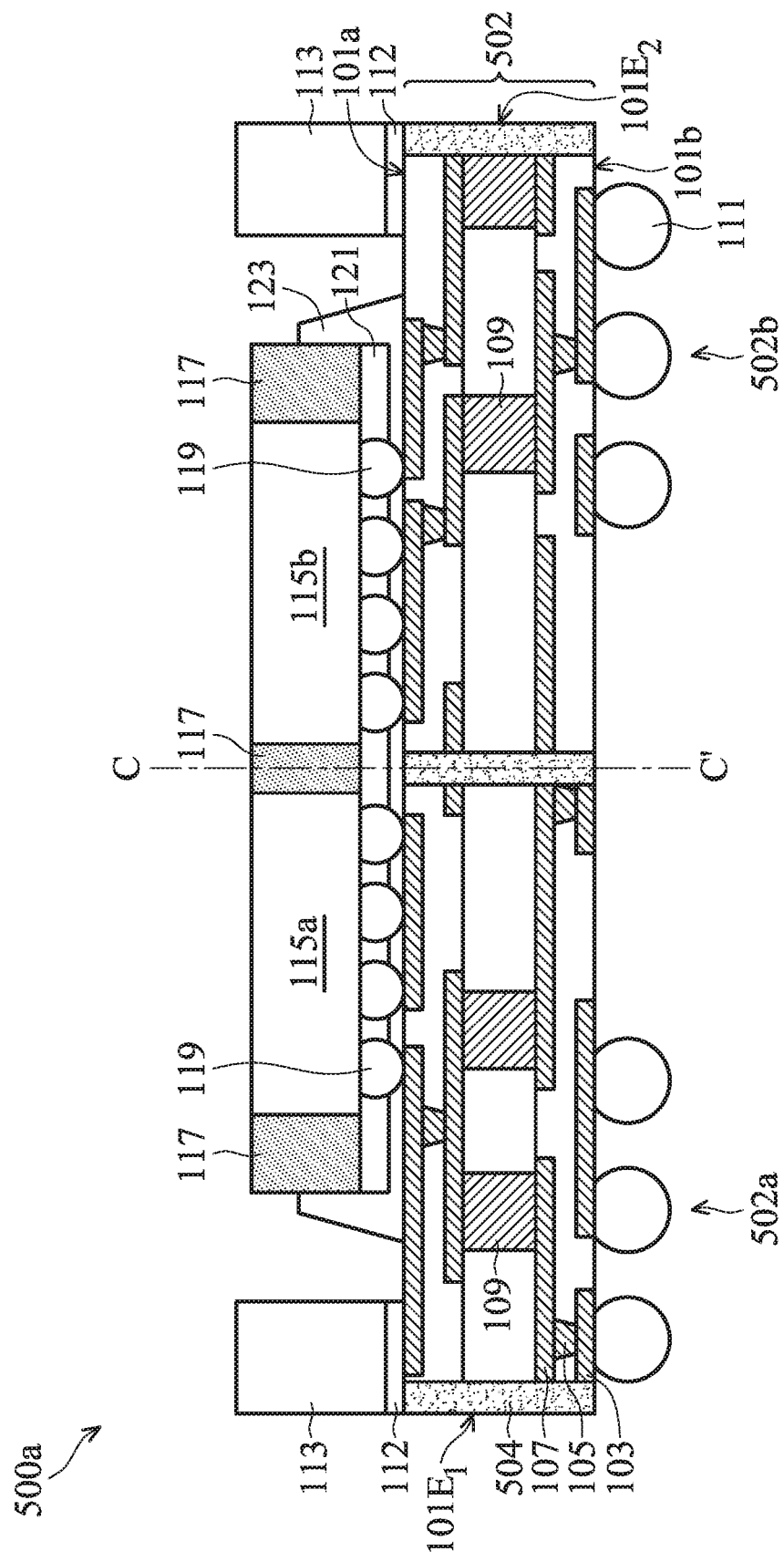
FIG. 5A-5B are cross-sectional views of semiconductor package structures, in accordance with some embodiments of the disclosure.

FIG. 5A is a cross-sectional view of a semiconductor package structure 500a, in accordance with some other embodiments of the disclosure. It should be noted that the semiconductor package structure 500a may include the same or similar components as that of the semiconductor package structures 100a and 100b, and for the sake of simplicity, those components will not be discussed in detail again. In comparison with the embodiment of FIGS. 1A-4B, the following embodiment provides a substrate 502 including a first substrate 502a and a second substrate 502b. By using a plurality of small substrates instead of a large substrate, the reliability of the semiconductor package structure can be further improved according to some embodiments of the present disclosure.

As shown in FIG. 5A, the first substrate 502a and the second substrate 502b are arranged side-by-side. The first substrate 502a has a first wiring structure therein, and the second substrate 502b has a second wiring structure therein. Each of the first substrate 502a and the second substrate 502b may be the same as or similar to the substrate 101 of the semiconductor package structures 100a and 100b.

The first substrate 502a and the second substrate 502b may be homogenous or heterogeneous. That is, the first substrate 502a and the second substrate 502b may be the same as, similar to, or different from each other. Each of the first wiring structure in the first substrate 502a and the second wiring structure in the second substrate 502b may be the same as or similar to the wiring structure in the substrate 101. The first wiring structure in the first substrate 502a may be the same as or different from the second wiring structure in the second substrate 502b. In some embodiments, each of the first wiring structure in the first substrate 502a and the second wiring structure in the second substrate 502b includes one or more conductive pads 103, conductive vias 105, conductive layers 107, and conductive pillars 109. The number of the conductive pads 103, the conductive vias 105, the conductive layers 107, and the conductive pillars 109 may be more or less in the first substrate 502a and the second substrate 502b than in the substrate 101.

The substrate 502 may be viewed as partitioned into the first substrate 502a and the second substrate 502b. Therefore, the first substrate 502a and the second substrate 502b may be also referred to as the first substrate partition 502a and the second substrate partition 502b. In order to improve performance of electronic devices, a greater number of semiconductor dies are bonded onto a larger substrate. However, some related issues also occur. For example, as the volume of the substrate increases, more defects may be introduced during fabricating. According to some embodiments of the present disclosure, where the substrate 502 includes two or more substrate partitions, smaller substrate partitions can also be used. Accordingly, the reliability and the design flexibility of the semiconductor package structure can be improved.

The substrate 502 further includes a molding material 504 surrounding the first substrate 502a and the second substrate 502b. The molding material 504 adjoins the sidewalls of the first substrate 502a and the second substrate 502b. The molding material 504 may be same as or similar to the molding material 117 of the semiconductor package structures 100a and 100b. The formation and the material of the molding material 504 may include the formation and the material as described above with respect to the molding material 117, and will not be repeated again. In some embodiments, the first substrate 502a and the second substrate 502b are separated by the molding material 504.

The semiconductor package structure 500a also includes a first semiconductor die 115a and a second semiconductor die 115b bonded onto the substrate 502 through a plurality of conductive structures 119. In some embodiments, the first semiconductor die 115a is disposed over the first substrate 502a and electrically coupled to the first wiring structure in the first substrate 502a, and the second semiconductor die 115b is disposed over the second substrate 502b and electrically coupled to the second wiring structure in the second substrate 502b.

In some embodiments, the conductive structures 119 are disposed between the substrate 502 and the first semiconductor die 115a and between the substrate 502 and the second semiconductor die 115b, and the bump structures 111 are disposed below the substrate 502. In some embodiments, the first semiconductor die 115a is electrically coupled to the bump structures 111 through the conductive structures 119 and the first wiring structure in the first substrate 502a, and the second semiconductor die 115b is electrically coupled to the bump structures 111 through the conductive structures 119 and the second wiring structure in the second substrate 502b.

Although the thickness of the first substrate 502a and the thickness of the second substrate 502b are substantially the same in Figures, the present disclosure is not limit thereto. In some embodiments, the thickness of the first substrate 502a and the thickness of the second substrate 502b are different. For example, the thicknesses of the first substrate 502a and the second substrate 502b may depend on the characteristics of the semiconductor dies form thereon. In some embodiments, the semiconductor package structure 500a having substrates 502 with different thicknesses can be used for, for example, dual-band antenna applications.

In this case, the size of components adjacent to the first substrate 502a and/or the second substrate 502b may be adjusted to provide a planar surface. For example, in the embodiments where the first substrate 502a is thicker than the second substrate 502b, the conductive structures 119 disposed between the second semiconductor die 115b and the second substrate 502b may be thicker than the conductive structures 119 disposed between the first semiconductor die 115a and the first substrate 502a to provide a planar surface for bonding the semiconductor dies 115a, 115b thereon.

In some embodiments, the first semiconductor die 115a and the second semiconductor die 115b are surrounded by the molding material 117. The first semiconductor die 115a and the second semiconductor die 115b may be separated by the molding material 117. In some embodiments, surfaces of the first semiconductor die 115a and the second semiconductor die 115b facing away from the substrate 502 are exposed by the molding material 117.

Still referring to FIG. 5A, the semiconductor package structure 500a includes a frame 113 disposed over the first substrate 502a and the second substrate 502b. The frame 113 may be attached to the substrate 502 through an adhesive layer 112. The first semiconductor die 115a and the second semiconductor die 115b may be surrounded by the frame 113. In some embodiments, the frame 113 is separated from the underfill layer 123 by a gap. The sidewalls of the frame 113 may be coplanar with the sidewalls of the molding material 504.

The frame 113 may include a metal ring or the inside of the frame 113 may include fluid. In some embodiments where the frame 113 including a metal ring, structural strength of the semiconductor package structure can be enforced. In some embodiments where the inside of the frame 113 including fluid, heat dissipation can be improved. The frame 113 is optional. In other embodiments, the semiconductor package structure does not include the frame 113.

Figure 5B:
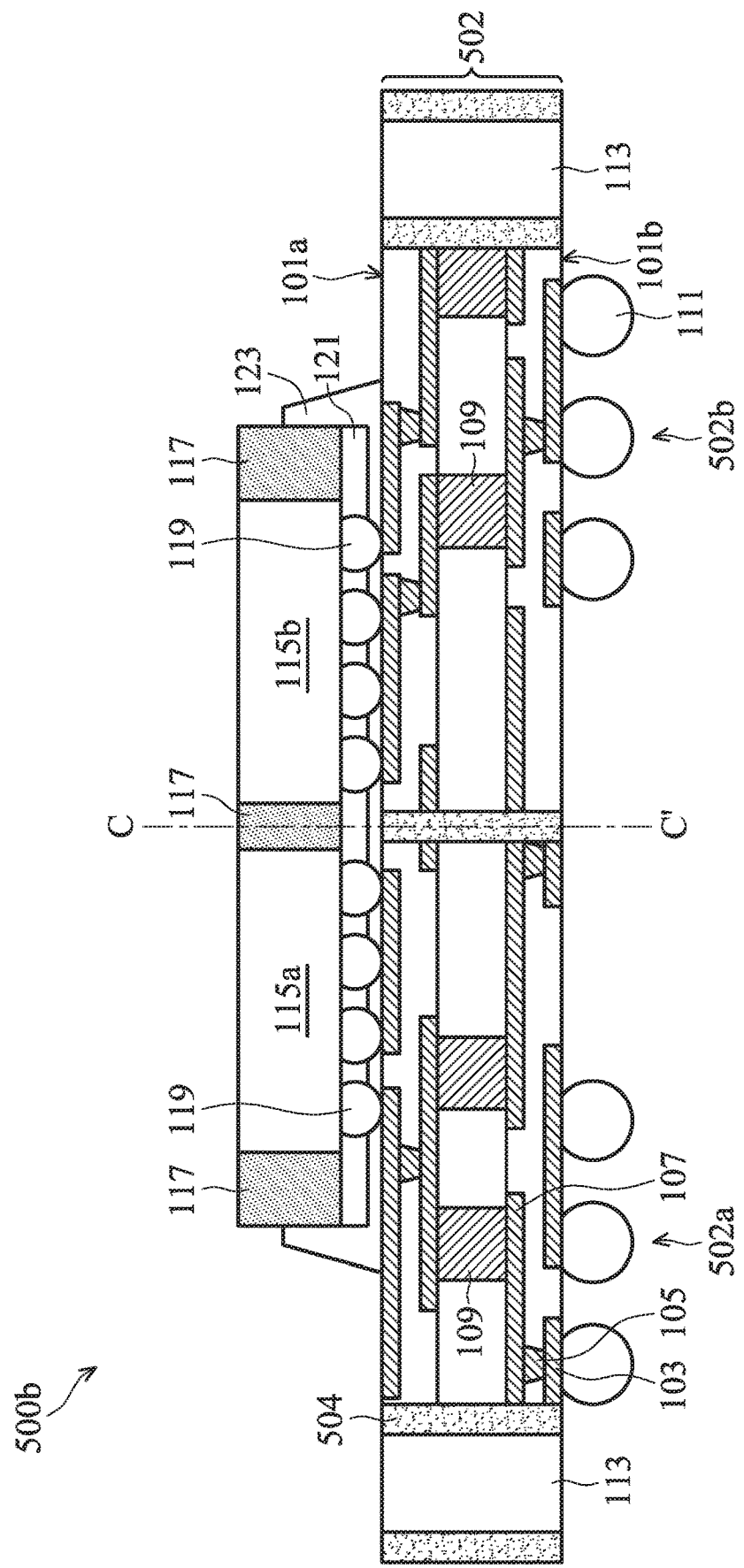

FIG. 5B is a cross-sectional view of a semiconductor package structure 500b, in accordance with some other embodiments of the disclosure. Descriptions of elements of the embodiments hereinafter that are the same as or similar to those previously described with reference to FIG. 5A are omitted for brevity.

As shown in FIG. 5B, the frame 113 is disposed on sidewalls of the substrate 502 and surrounds the first substrate 502a and the second substrate 502b. The frame 113 may be surrounded by the molding material 504. In some embodiments, the frame 113 is separated from the first substrate 502a and the second substrate 502b by the molding material 504. The top surface of the frame 113 may be coplanar with the top surface of the molding material 504, and the bottom surface of the frame 113 may be coplanar with the bottom surface of the molding material 504.

One of the methods to solve the warping or cracking problems caused by mismatched CTEs is to increase the thickness of the core layer of the substrate 502. However, this method may cause some problems, such as increased costs and complicated processing. The embodiment of the present disclosure providing the frame 113 disposed on sidewalls of the substrate 502 and surrounding the first substrate 502a and the second substrate 502b can increase the strength of the substrate 502, thereby reducing the thickness of the core layer of the substrate 502 and preventing the related issues.

Figure 6A:
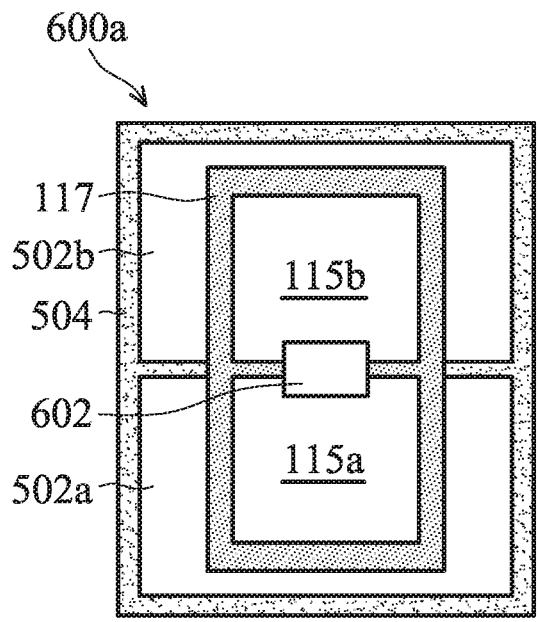
FIG. 6A-6C are plan views of semiconductor package structures, in accordance with some embodiments of the disclosure.
Figure 6B:
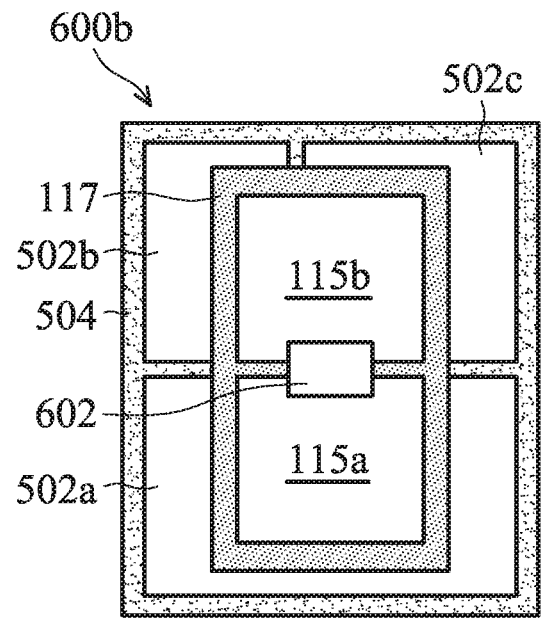
Figure 6C:
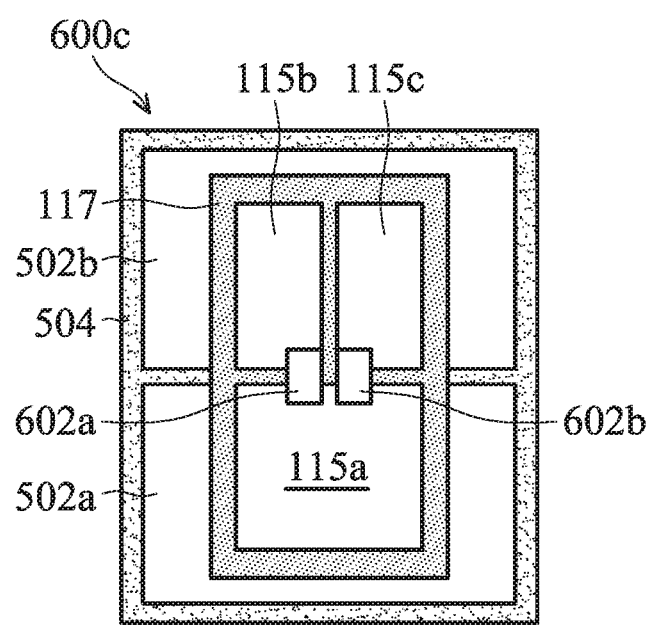

FIGS. 6A-6C are plan views of semiconductor package structures 600a, 600b and 600c, in accordance with some embodiments of the disclosure. For brevity, some components are omitted.

FIG. 6A may be the plan view from the top of the semiconductor package structure 500a in FIG. 5A or the top of the semiconductor package structure 500b in FIG. 5B. As shown in FIG. 6A, the semiconductor package structure 600a includes the first substrate 502a, the second substrate 502b, the first semiconductor die 115a over the first substrate 502a, and the second semiconductor die 115b over the second substrate 502b. The arrangement is merely example and is not intended to be limiting. For example, the first semiconductor die 115a may be disposed over the first substrate 502a and the second substrate 502b in some embodiments.

The first semiconductor die 115a and the second semiconductor die 115b may be electrically connected with each other through wires 602 from the top surfaces of the first semiconductor die 115a and the second semiconductor die 115b. Further, in some embodiments, a portion of the molding material 504 is overlapped with a portion of the molding material 117 from the plan view.

In some embodiments of the present disclosure, the semiconductor package structure 600b includes more than two substrates. As shown in FIG. 6B, the semiconductor package structure 600b further includes a third substrate 502c. The first substrate 502a, the second substrate 502b, and the third substrate 502c may be surrounded by the molding material 504. In some embodiments, the first substrate 502a, the second substrate 502b and the third substrate 502c are separated by the molding material 504.

The third substrate 502c may have a third wiring structure. The third wiring structure in the third substrate 502c may be the same as or different from the first wiring structure in the first substrate 502a or the second wiring structure in the second substrate 502b. In some embodiments, the first semiconductor die 115a and/or the second semiconductor die 115b is also electrically coupled to the third wiring structure in the third substrate 502c. The first semiconductor die 115a and the second semiconductor die 115b may be electrically connected with each other through the wires 602 from the top surfaces of the first semiconductor die 115a and the second semiconductor die 115b.

As shown in FIG. 6B, the second semiconductor die 115b is disposed over the second substrate 502b and the third substrate 502c, wherein the third substrate 502c is disposed adjacent to the first substrate 502a and the second substrate 502b. The arrangement is merely example and is not intended to be limiting. For example, the third substrate 502c may be disposed adjacent to the first substrate 502a or the second substrate 502b only. Alternatively, the first semiconductor die 115a may be disposed over the first substrate 502a and the third substrate 502c.

In some embodiments of the present disclosure, the semiconductor package structure 600c includes more than two semiconductor dies. As shown in FIG. 6C, the semiconductor package structure 600c further includes a third semiconductor die 115c disposed over the second substrate 502b and electrically coupled to the second wiring structure in the second substrate 502b. The third semiconductor die 115c may be bonded onto the second substrate 502b through a plurality of conductive structures (not shown).

In some embodiments, the first semiconductor die 115a, the second semiconductor die 115b and the third semiconductor die 115c are surrounded by the molding material 117. In some embodiments, the first semiconductor die 115a, the second semiconductor die 115b and the third semiconductor die 115c are separated by the molding material 117. The third semiconductor die 115c may be the same as or different from the first semiconductor die 115a or the second semiconductor die 115b.

The first semiconductor die 115a and the second semiconductor die 115b may be electrically connected with each other through the wires 602a from the top surfaces of the first semiconductor die 115a and the second semiconductor die 115b, and the first semiconductor die 115a and the third semiconductor die 115c may be electrically connected with each other through the wires 602b from the top surfaces of the first semiconductor die 115a and the third semiconductor die 115c. The arrangement is merely example and is not intended to be limiting. For example, the second semiconductor die 115b and the third semiconductor die 115c may be electrically connected with each other through wires from the top surfaces of the second semiconductor die 115b and the third semiconductor die 115c.

As shown in FIG. 6C, the third semiconductor die 115c is disposed over the second substrate 502b, and the third substrate 502c is disposed adjacent to the first semiconductor die 115a and the second semiconductor die 115b. The arrangement is merely example and is not intended to be limiting. For example, the third substrate 502c may be disposed over the first substrate 502a or an additional substrate (not shown). It should be noted that the number of semiconductor dies and the number of substrates in the semiconductor package structures 600a-600c are not limited to that disclosed in the embodiment.

Figure 7:
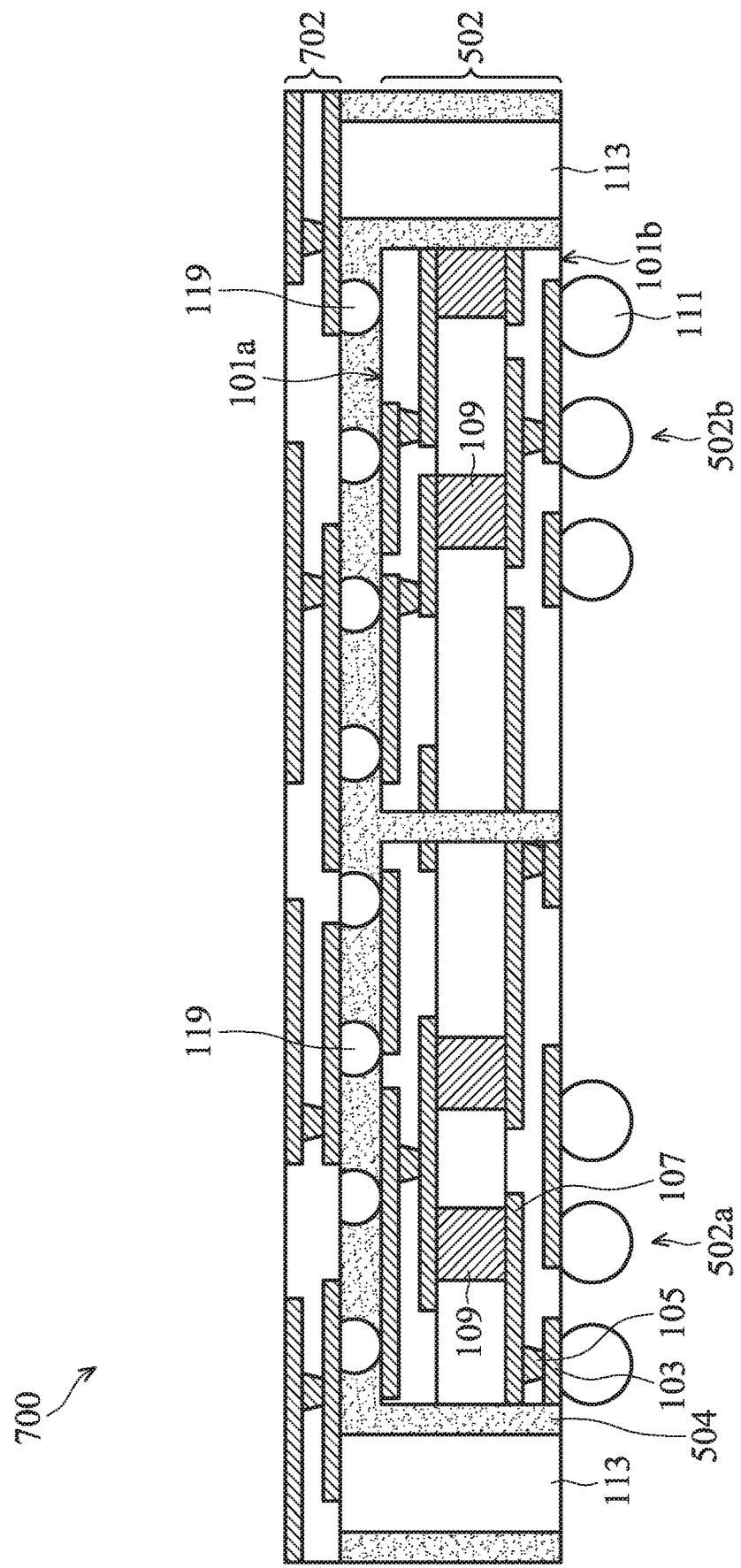
FIG. 7 is a cross-sectional view of a semiconductor package structure, in accordance with some embodiments of the disclosure.

FIG. 7 is a cross-sectional view of a semiconductor package structure 700, in accordance with some other embodiments of the disclosure. The semiconductor package structure 700 may include the same or similar components as that of the semiconductor package structures 500a and 500b, and for the sake of simplicity, those components will not be discussed in detail again.

As shown in FIG. 7, a redistribution layer 702 is disposed over the substrate 502. In some embodiments, the redistribution layer 702 includes one or more dielectric layers, wiring layers, or any other suitable structures. The redistribution layer 702 may cover the first substrate 502a and the second substrate 502b, and the redistribution layer 702 may be electrically coupled to the first wiring structure in the first substrate 502a and the second wiring structure in the second substrate 502b.

The redistribution layer 702 may be bonded onto the substrate 502 through a plurality of conductive structures 119. In some embodiments, the conductive structures 119 are disposed between the redistribution layer 702 and the first substrate 502a and between the redistribution layer 702 and the second substrate 502b. In some embodiments, the redistribution layer 702 is electrically coupled to the bump structures 111 through the conductive structures 119, the first wiring structure in the first substrate 502a, and the second wiring structure in the second substrate 502b.

As mentioned above, the size of components adjacent to the first substrate 502a and/or the second substrate 502b may be adjusted to provide a planar surface. In some embodiments, the first substrate 502a is thicker than the second substrate 502b, and the conductive structures 119 disposed between the redistribution layer 702 and the second substrate 502b may be thicker than the conductive structures 119 disposed between the redistribution layer 702 and the first substrate 502a to provide a planar surface for bonding the redistribution layer 702 thereon.

As shown in FIG. 7, the redistribution layer 702 covers the frame 113, and the frame 113 is thicker than the first substrate 502a and the second substrate 502b to support the redistribution layer 702. The sidewalls of the redistribution layer 702 may be coplanar with the sidewalls of the molding material 504. In other embodiments, the redistribution layer 702 exposes the frame 113 or partially covers the frame 113. In these embodiments, the frame 113 may surround the redistribution layer 702.

As mentioned above, the thickness of the substrate 502 can be reduced by disposing the frame 113 thereon. In some embodiments, a double-sided substrate fabricating process can be used for fabricating thin substrates. In particular, in the double-sided substrate fabricating process, interconnect structures are simultaneously formed on opposite surfaces of a carrier substrate, and then the interconnect structures are separated from the carrier substrate to form the thin substrates.

Figure 8:
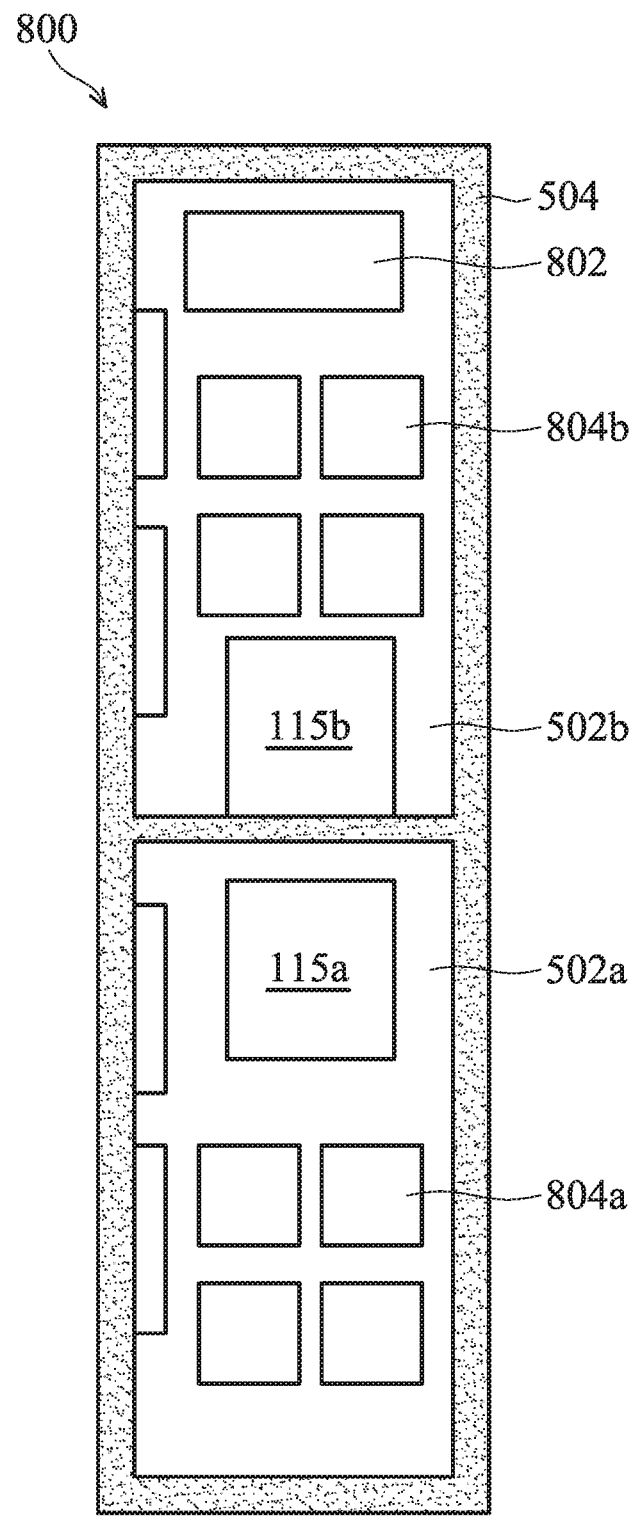
FIG. 8 is a plan view of a semiconductor package structure, in accordance with some embodiments of the disclosure.

FIG. 8 is a plan view of a semiconductor package structure 800, in accordance with some embodiments of the disclosure. The semiconductor package structure 800 is an exemplary embodiment including dual-band antenna structures. For example, the semiconductor package structure 800 may be used for 5G application. For brevity, some components are omitted.

As shown in FIG. 8, the semiconductor package structure 800 includes a plurality of first antenna structures 804a and a plurality of second antenna structures 804b. The first antenna structures 804a may be disposed over the first substrate 502a and electrically coupled to the first wiring structure in the first substrate 502a. The second antenna structures 804b may be disposed over the second substrate 502b and electrically coupled to the second wiring structure in the second substrate 502b. In some embodiments, the semiconductor package structure 800 further includes a connector 802 disposed over the second substrate 502b and not disposed over the first substrate 502a.

As mentioned above, the substrate of the semiconductor package structure can includes substrate partitions with different thicknesses for different applications. For example, the first antenna structures 804a and the second antenna structures 804b may be used for different bands, and the thicknesses of the first substrate 502a and the second substrate 502b may be different. Therefore, antenna structures with different bands can be disposed in one semiconductor package structure 800. The reliability and the design flexibility of the semiconductor package structure 800 can be improved, and the cost of manufacture can be reduced, according to some embodiments.

According to some embodiments of the present disclosure, a semiconductor package structure having a plurality of substrates arranged side-by-side is provided. By using a plurality of small substrates, it is unnecessary to form a large substrate for bonding a great number of semiconductor dies thereon. Since it is easier to form a small substrate than a large substrate, the reliability of the semiconductor package structure can be improved, according to some embodiments.

Further, according to some embodiments of the present disclosure, the substrates can have different thicknesses for different applications. In some embodiments, antenna structures for different bands can be disposed in one semiconductor package structure. Therefore, the design flexibility of the semiconductor package structure can be improved.

Moreover, in these embodiments, thickness of components adjacent to the substrates can be adjusted to provide a planar surface.

In addition, according to some embodiments of the present disclosure, the semiconductor package structure includes a frame surrounding the substrates to increase the strength of the semiconductor package structure. Therefore, the thickness of the substrates can be reduced without decreasing the strength of the substrates. Further, in some embodiments, depending on the material of the frame, structural strength of the semiconductor package structure can be enforced, or heat dissipation can be improved.

Many variations and/or modifications can be made to embodiments of the disclosure. The semiconductor package structures in accordance with some embodiments of the disclosure can be used to form a three-dimensional (3D) package, a 2.5D package, a fan-out package, or another suitable package. In addition, the arrangements, the shapes, and the locations of the holes in the substrate can be adjusted according to the types of the application.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a substrate having a first surface and a second surface opposite to the first surface and comprising:
      a first substrate partition having a first wiring structure; and
      a second substrate partition adjacent to the first substrate partition and having a second wiring structure,
      wherein the first substrate partition and the second substrate partition are surrounded by a first molding material;
   a first semiconductor die disposed over the first surface of the substrate and electrically coupled to the first wiring structure;
   a second semiconductor die disposed over the first surface of the substrate and electrically coupled to the second wiring structure; and
   a plurality of bump structures disposed over the second surface of the substrate, wherein the first molding material extends from the first surface of the substrate to the second surface of the substrate.

2. The semiconductor package structure as claimed in claim 1, wherein the first substrate partition and the second substrate partition are homogenous.

3. The semiconductor package structure as claimed in claim 1, wherein the first substrate partition and the second substrate partition are heterogeneous.

4. The semiconductor package structure as claimed in claim 1, wherein the first substrate partition and the second substrate partition are separated by the first molding material.

5. The semiconductor package structure as claimed in claim 1, wherein the first semiconductor die and the second semiconductor die are surrounded and separated by a second molding material.

6. The semiconductor package structure as claimed in claim 5, wherein surfaces of the first semiconductor die and the second semiconductor die facing away from the substrate are exposed by the second molding material.

7. The semiconductor package structure as claimed in claim 1, further comprising a third substrate partition adjacent to the first substrate partition and/or the second substrate partition, and the third substrate partition has a third wiring structure, wherein the first substrate partition, the second substrate partition and the third substrate partition are surrounded by the first molding material.

8. The semiconductor package structure as claimed in claim 7, wherein the first substrate partition, the second substrate partition and the third substrate partition are separated by the first molding material.

9. The semiconductor package structure as claimed in claim 7, wherein the first semiconductor die or the second semiconductor die is also electrically coupled to the third wiring structure.

10. The semiconductor package structure as claimed in claim 1, further comprising a third semiconductor die disposed over the substrate and electrically coupled to the first wiring structure and/or the second wiring structure.

11. The semiconductor package structure as claimed in claim 10, wherein the first semiconductor die, the second semiconductor die and the third semiconductor die are surrounded and separated by a second molding material.

12. The semiconductor package structure as claimed in claim 1, further comprising:
   a plurality of conductive structures disposed between the substrate and the first semiconductor die and between the substrate and the second semiconductor die,
   wherein the first semiconductor die and the second semiconductor die are electrically coupled to the plurality of bump structures through the plurality of conductive structures, the first wiring structure and the second wiring structure, respectively.

13. The semiconductor package structure as claimed in claim 1, further comprising a frame disposed over the first substrate partition and the second substrate partition, wherein the frame surrounds the first semiconductor die and the second semiconductor die.

14. The semiconductor package structure as claimed in claim 1, further comprising a frame surrounding the first substrate partition and the second substrate partition, wherein the frame is surrounded by the first molding material.

15. A semiconductor package structure, comprising:
   a first substrate having a first surface and a second surface opposite to the first surface and having a first wiring structure;
   a second substrate having a third surface and a fourth surface opposite to the third surface and having a second wiring structure, wherein the first substrate and the second substrate are arranged side-by-side and surrounded by a molding material;
   a redistribution layer disposed over the first surface of the first substrate and the third surface of the second substrate, wherein the redistribution layer is electrically coupled to the first wiring structure and the second wiring structure;
   a frame surrounding the first substrate and the second substrate; and
   a plurality of bump structures disposed over the second surface of the first substrate and the fourth surface of the second substrate, wherein the molding material extends from the first surface of the first substrate and the third surface of the second substrate to the second surface of the first substrate and the fourth surface of the second substrate.

16. The semiconductor package structure as claimed in claim 15, further comprising a plurality of conductive structures disposed between the redistribution layer and the first substrate and between the redistribution layer and the second substrate.

17. The semiconductor package structure as claimed in claim 16, wherein the first substrate is thicker than the second substrate, and the plurality of conductive structures disposed between the redistribution layer and the second substrate is thicker than the plurality of conductive structures disposed between the redistribution layer and the first substrate.

18. The semiconductor package structure as claimed in claim 15, wherein the redistribution layer covers the frame.

19. The semiconductor package structure as claimed in claim 15, wherein the redistribution layer covers the first substrate and the second substrate and exposes the frame.

20. A semiconductor package structure, comprising:
a first substrate having a first surface and a second surface opposite to the first surface and having a first wiring structure;
a second substrate having a third surface and a fourth surface opposite to the third surface and having a second wiring structure, wherein the first substrate and the second substrate are arranged side-by-side and surrounded by a molding material;
a first semiconductor die disposed over the first surface of the first substrate and electrically coupled to the first wiring structure;
a second semiconductor die disposed over the third surface of the second substrate and electrically coupled to the second wiring structure;
a plurality of first antenna structures disposed over the first surface of the first substrate and electrically coupled to the first wiring structure;
a plurality of second antenna structures disposed over the third surface of the second substrate and electrically coupled to the second wiring structure; and
a plurality of bump structures disposed over the second surface of the first substrate and the fourth surface of the second substrate, wherein the molding material extends from the first surface of the first substrate and the third surface of the second substrate to the second surface of the first substrate and the fourth surface of the second substrate.

21. The semiconductor package structure as claimed in claim 20, further comprising a connector disposed over the second substrate and not disposed over the first substrate.

* * * * *